Jan. 12, 1965 S. V. CAMPBELL 3,165,645

SOLID STATE RELAY UTILIZING TWO TERMINAL, TWO-STATE ELEMENTS AND CONTROLLED PULSE PRODUCING MEANS

Filed March 27, 1962

INVENTOR
SCOTT V. CAMPBELL

BY Hurvitz & Rose

ATTORNEYS

United States Patent Office 3,165,645
Patented Jan. 12, 1965

3,165,645

SOLID STATE RELAY UTILIZING TWO TERMINAL, TWO-STATE ELEMENTS AND CONTROLLED PULSE PRODUCING MEANS

Scott V. Campbell, Melbourne, Fla., assignor to Radiation, Incorporated, Melbourne, Fla., a corporation of Florida Filed Mar. 27, 1962, Ser. No. 182,828
13 Claims. (Cl. 307—88.5)

Figures 1, 2:
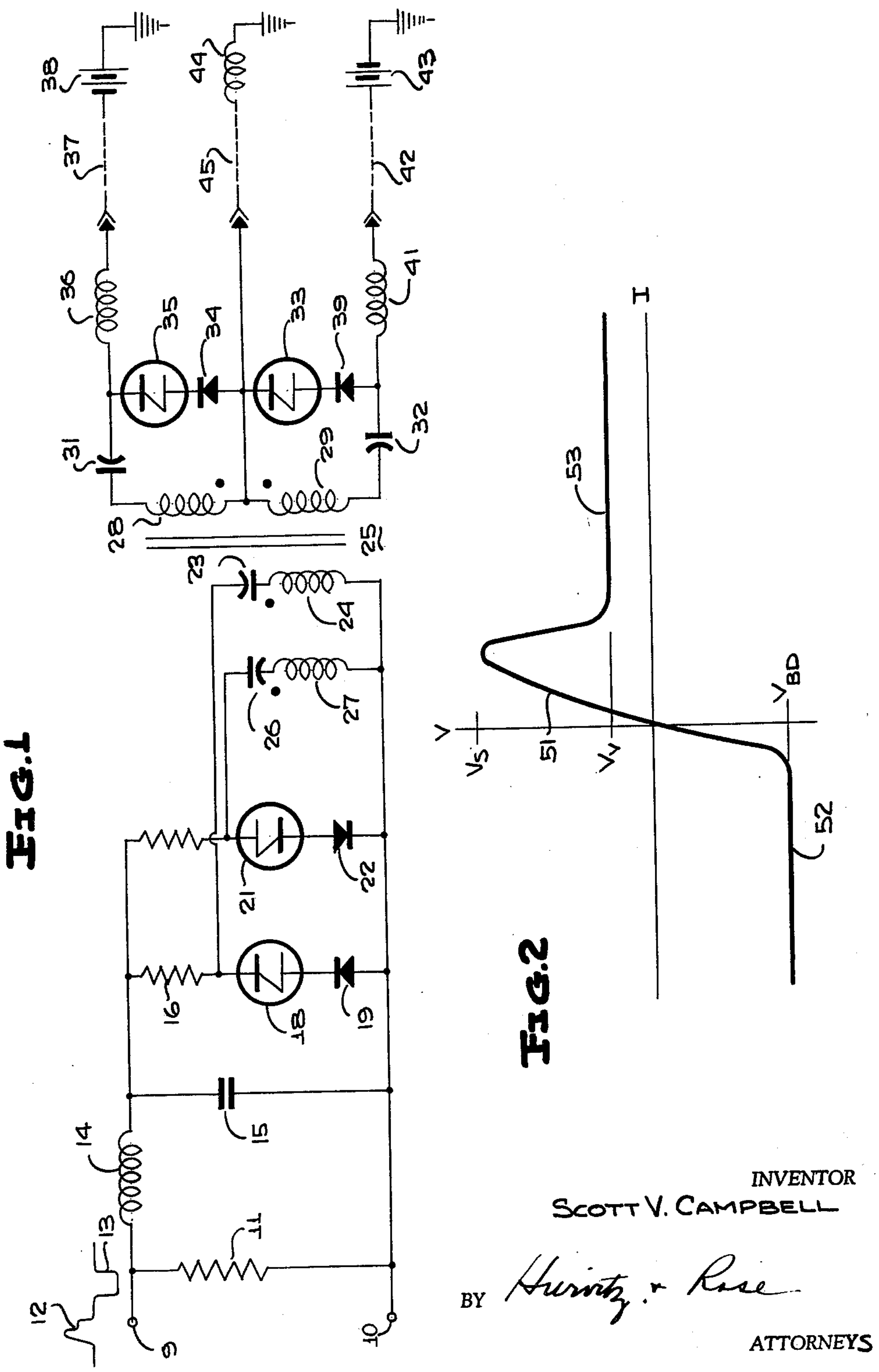

The present invention relates generally to solid state relay circuits and more particularly to a circuit employing four-layer diodes and pulse forming circuits to control the application of a potential to a load.

The need presently exists in the teletype, telegraph, and in general switching applications of high reliability for a solid state circuit with high current and voltage ratings but which does not require an internal power supply. Such a circuit preferably has high input impedance so that there is little or no current drain from the source which is supplying it. It must also frequently have the ability to be connected as a bi-lateral switch which is responsive to voltage or current pulses of either polarity to connect either polarity external voltage to an external load. For most applications, a solid state relay must also be capable of switching from the low to the high impedance state in a relatively fast time with minimum internal dissipation.

The present invention provides a switch meeting these requirements by employing four-layer diodes. A pair of four-layer diodes is connected to be responsive to input pulses of opposite polarity, one diode being activated into its highly conductive region by a positive pulse and the other diode being activated into its highly conductive region by the application of a negative pulse. Across each of the four-layer diodes is a shock-excited oscillatory circuit. When a diode is activated into its low impedance region by the application of input pulses of required polarity, its respective shock-excited circuit is activated to apply a switching pulse to a second pair of normally, non-conducting four-layer diode elements. One of the second pair of four-layer diodes is adapted to couple a negative potential to an external load while the other four-layer diode is connected to couple a positive potential to the load.

The coupling circuit for the pulses to the second pair of four-layer diodes includes a transformer having a pair of primary windings and a pair of secondary windings. Each primary winding is connected in a separate one of the shock-excited pulse forming circuits while each secondary winding is connected across a separate one of the second pair of four-layer diodes. The four-layer diode activated by the generated pulse remains conducting for a period of time determined by the oscillatory period of the pulse which is formed in the primary winding of the transformer.

It is, accordingly, an object of the present invention to provide a new and improved solid state relay or switching circuit employing four-layer diodes.

It is another object of the present invention to provide a solid state relay circuit employing four-layer diodes, which circuit has high current and voltage handling ability.

It is a further object of the present invention to provide a solid state polarized relay circuit employing four-layer diode elements.

Another object of the present invention is to provide a solid state relay circuit which requires no external power supply, has a low level of internal dissipation and a high input impedance so that pulses applied thereto need not be of a high power level.

It is still another object of the present invention to provide a new and improved solid state relay circuit which is capable of fast switching times wherein four-layer diodes are connected across a shock-excited circuit.

The above and still further objects, features and advantages of the present invention will become apparent upon consideration of the following detailed description of one specific embodiment thereof, especially when taken in conjunction with the accompanying drawings, wherein:

FIGURE 1 is a circuit diagram of a preferred embodiment of the present invention; and FIGURE 2 is a characteristic curve of the four-layer diode of the type employed in FIGURE 1.

Referring now to FIGURE 1 of the drawings, there is disclosed a resistor 11 connected to an external source which supplies current pulses 12 and 13 of opposite polarity thereto via terminals 9 and 10. A low-pass filter network including inductor 14 and capacitor 15 is connected to the terminals of resistor 11 so that any high frequency current or voltage spikes applied across the resistor 11 are not applied to the remainder of the circuit. Connected to the junction of inductor 14 and capacitor 15 is a pair of resistors 16 and 17, connected in separate branch circuits. The opposite end of resistor 16 is connected to the cathode of four-layer diode 18, the anode of which is connected via diode 19 to the junction of capacitor 15 and resistor 11. Resistor 17 is connected to the anode of four-layer diode 21 which has its cathode connected to the anode of conventional diode 22. The cathode of diode 22 is connected to the junction between resistor 11 and capacitor 15, terminal 10.

Connected in parallel with diodes 18 and 19 is a circuit including capacitor 23 which is series connected with a primary winding 24 of transformer 25. A similar circuit including capacitor 26 and a further primary winding 27 of transformer 25 is connected across the series combination of diodes 21 and 22.

The primary windings 24 and 27 of transformer 25 are coupled to the secondary windings 28 and 29 having the directions of their windings related to the primary windings indicated by the dot convention on the drawings. Thus, when the voltage at the dotted ends of either of the primary windings 24 or 27 is positive relative to the undotted ends thereof, the voltages at the dotted ends of secondary windings 28 and 29 are positive relative to the undotted ends of these windings. Coupling capacitors 31 and 32 are connected to the undotted ends of secondary windings 28 and 29, respectively. The dotted ends of secondary windings 28 and 29 are connected together and to the junction formed by the cathode of four-layer diode 33 and the anode of conventional diode 34. The cathode of diode 34 is connected to the anode of a further four-layer diode 35, the cathode of which is connected to capacitor 31. The junction between capacitor 31 and diode 35 is connected via a choke coil and a long line 37 to an external negative power supply 38. A similar circuit is established from the anode of four-layer diode 33 through the cathode to anode path of conventional diode 39, choke coil 41, and through line 42 to positive source 43. An external load 44 is connected via line 45 to the common junction of the dotted ends of transformers secondary windings 28 and 29.

Each of the four-layer diode elements 18, 21, 33 and 35 of FIGURE 1 has a characteristic curve as depicted in FIGURE 2. This characteristic curve has a high impedance region 51 between the switching voltage, $V_s$, and the voltage breakdown, $V_{bd}$. In the region 51, the four-layer diode is essentially a non-conducting infinite impedance, open circuit switch. If the voltage applied to the four-layer diode between the anode and cathode, exceeds $-V_{bd}$, the unit conducts heavily due to reverse current breakdown and acts as a substantially short circuit, as depicted by the portion of the characteristic curve indicated by reference numeral 52. When the four-layer diode is forward biased to such magnitude as to exceed $V_s$, it conducts heavily and is quickly driven into the low, positive impedance conduction state, indicated by reference numeral 53. Once the element is driven into its low, positive impedance portion of its characteristic curve 53, it has a tendency to remain there unless the voltage applied across the unit drops lower than $V_v$. If this occurs, the element is restored to its high forward impedance state, indicated on the curve by numeral 51.

The operation of the circuit is as follows. When the positive current pulse 12 applied to terminal 9 is of sufficient amplitude to cause the voltage across resistor 11 to reach the switching voltage, $V_s$, of four-layer diode 21, the diode suddenly conducts. This sudden conduction of diode 21 results in an oscillatory current being established in inductor 27, capacitor 26, and diodes 21 and 22. In the first half cycle, the oscillation causes the dotted end of winding 27 to be at a negative voltage with respect to the undotted end thereof. This results in a negative voltage being applied to the dotted end of winding 29 through step-up transformer 25. Normally, the voltage applied to diode 33 by battery 43 is insufficient to fire the diode. However, the pulse derived from primary winding 27 is of such polarity and amplitude when applied to the anode of four-layer diode 33 to cause it to fire. This pulse is coupled to the diode 33 through the coupling capacitor 32 which serves to prevent D.C. current from source 43 being applied to winding 29. When diode 33 is rendered conductive in response to the pulse, it conducts heavily, causing current from battery 43 to be applied through line 42, inductor 41, diodes 39 and 33 and line 45 to external load 44. Inductor 41 prevents application of the pulse to line 42 and D.C. source 43 and forces the current through the series combination of diodes 39 and 33.

As the negative half cycle of the oscillating current in the resonant circuit including capacitor 26 and inductor 27 reaches an intermediate point between its zero and maximum value, four-layer diode 21 is driven to cut-off, causing the dotted end of inductor 27 to become positive but at less of a value than during the previous half-cycle of current. This positive pulse is reflected to secondary windings 28 and 29 to cut off four-layer diode 33. The voltage applied to winding 28 in response to this half cycle of current in winding 27 and condenser 26 is of insufficient magnitude, however, to cause four-layer diode 35 to conduct.

During the first half cycle, when the undotted end of winding 28 is of greater voltage than the dotted end thereof, four-layer diode 35 is not driven to its reverse breakdown characteristic 52 because of the inclusion of diode 34. Reverse current breakdown will not occur even if the voltage is of sufficient amplitude because the reverse voltage is divided between the two series connected diodes so that neither of them conducts. Similarly, diode 19 is included in series with four-layer diode 18 to prevent the possibility of diode 18 breaking into reverse current conduction upon the application of a negative pulse 12 to it.

When a negative current pulse 13 is applied to terminal 9 the same operations occur for the pulsing circuit including diode 18, winding 24 and condenser 23 but in the opposite direction to the positive responsive circuit including diode 21, condenser 26 and winding 27 in response to the positive current pulse 12. A negative voltage is applied by battery 38 to external load 44 through diode 35 in response to the oscillating current established in the primary winding 24. Diodes 22 and 39 block reverse current flow through four layer diodes 21 and 33 in the same manner in which diodes 19 and 34 cooperate with four layer diodes 18 and 35, respectively.

While I have described and illustrated one specific embodiment of my invention, it will be clear that variations of the details of construction which are specifically illustrated and described may be resorted to without departing from the true spirit and scope of the invention as defined in the appended claims.

I claim:

1. A circuit for connecting a potential to a load in response to predetermined amplitude levels of a signal source comprising first and second two terminal semiconducting elements, each of said elements having a conducting and a non-conducting state, each of said elements being rendered into the conducting state between its said two terminals from the normally non-conducting state upon the application of a first voltage of predetermined magnitude and polarity across its said two terminals and into the non-conducting state from the conducting state upon the application of a second predetermined voltage magnitude across its said two terminals, said first predetermined voltage magnitude being less than the predetermined amplitude, said second predetermined voltage magnitude being less than the first predetermined voltage magnitude, first means for connecting said two terminals of said first element to the signal source, a shock excited oscillatory circuit connected across said two terminals of said first element, second means for connecting the load and the potential to said two terminals of the second element, and means for coupling the wave of the shock excited circuit to said two terminals of the second element to couple the potential to the load in response to energization of said shock excited circuit by conduction of said first element.

2. The circuit of claim 1 wherein each of said elements is a four layer diode, and including a separate diode in series with each of said elements for preventing reverse current breakdown in response to voltages of opposite polarity to said first predetermined voltage.

3. The circuit of claim 1 wherein said oscillatory circuit includes the primary winding of a transformer, said means for coupling including said primary winding, and a series circuit including a secondary winding of the transformer and a coupling capacitor connected across said second element.

4. The circuit of claim 1 wherein said first connecting means includes means for isolating said first element from high frequency pulses.

5. The circuit of claim 1 wherein said second connecting means includes means for isolating the oscillatory wave from the potential.

6. A circuit for connecting a potential of a first polarity and a potential of a second polarity to a load in response to predetermined signal amplitude levels of first and second polarities, respectively, comprising first, second, third, and fourth normally non-conducting four layer diodes, said first and second four layer diodes being connected to the signal in oppositely poled directions, first and second shock excited circuits connected across said first and second four layer diodes, respectively, means for connecting the first potential and the load to opposite terminals of the third four layer diode, means for connecting the second potential and the load to opposite terminals of the fourth four layer diode, first means for coupling the oscillatory wave of the first shock excited circuit to the third four layer diode to render it conductive to apply the first potential to the load, and second means for coupling the oscillatory wave of the second shock excited circuit to the fourth four layer diode to render it conductive to apply the second potential to the load.

7. The circuit of claim 6 wherein said first and second means for coupling includes a transformer having first and second primary windings and first and second secondary windings, said first and second primary windings being connected in the first and second shock excited circuits, respectively, said first and second secondary windings being connected across the third and fourth four layer diodes, respectively.

8. A circuit for connecting a potential of a first polarity and a potential of a second polarity to a load in response to predetermined signal amplitude levels of first and second polarities, respectively, comprising first, second, third, and fourth semi-conducting elements, each of said elements having a conducting and a non-conducting state, said elements being rendered into the conducting state from the non-conducting state upon the application of a first voltage of predetermined magnitude and polarity across its terminals and into the non-conducting state from the conducting state upon the application of a second predetermined voltage across its terminals, said first predetermined voltage magnitude being less than the predetermined amplitude, said second predetermined voltage magnitude being less than the first predetermined voltage magnitude, first and second shock excited circuits connected across the said first and second elements, respectively, means for connecting the first potential and the load to opposite terminals of the third element, means for connecting the second potential and the load to opposite terminals of the fourth element, first means for coupling the oscillatory wave of the first shock excited circuit to the third element to render it conductive to apply the first potential to the load, and second means for coupling the oscillatory wave of the second shock excited circuit to the fourth element to render it conductive to apply the second potential to the load.

9. A circuit for connecting a potential to a load in response to predetermined amplitude levels of a signal source comprising first and second two terminal semi-conducting elements, each of said elements having a conducting and a non-conducting state, each of said elements being rendered into the conducting state between its said two terminals from the normally non-conducting state upon the application of a first voltage of predetermined magnitude and polarity across its said two terminals and into the non-conducting state from the conducting state upon the application of a second predetermined voltage across its said two terminals, said first predetermined voltage magnitude being less than the predetermined amplitude, said second predetermined voltage magnitude being less than the first predetermined voltage magnitude, first means for connecting said two terminals of said first element to the signal source, means for generating a pulse when said first element is rendered conductive in response to attainment of the predetermined amplitude level by the signal, and means for coupling the pulse generated by said last named means to said two terminals of the second element and means for coupling the potential to the load through the second element when the pulse of the generating means is derived.

10. In a circuit for connecting a potential to a load in response to predetermined amplitude levels of a signal source, first and second two terminal semi-conducting elements, each of said elements having a conducting and a non-conducting state, each of said elements being rendered into the conducting state between its two terminals from the normally non-conducting state upon the application of a first voltage of predetermined magnitude and polarity across its said two terminals and into the non-conducting state from the conducting state upon the application of a second predetermined voltage across its said two terminals, said first predetermined voltage magnitude being less than the predetermined amplitude, said second predetermined voltage magnitude being less than the first predetermined voltage magnitude, first means for connecting said two terminals of said first element to the signal source, means for generating a pulse when said first element changes state in response to attainment of the predetermined amplitude level by the signal, and means for coupling the pulse generated by said last named means to said two terminals of the second element to change the state thereof and means for coupling the potential to the load through the second element when the second element changes state 11. A switching circuit for selectively coupling a power source to a load in response to pulses of predetermined amplitude and polarity comprising first and second four layer diodes, means for coupling said pulses across said first diode to trigger the diode into conduction, a transformer having primary and secondary windings, a capacitor connecting said primary winding in series circuit across the anode and cathode of said first diode, means for connecting said load and said source in series circuit with the anode cathode path of said second diode and means for connecting the secondary winding of said transformer across the anode and cathode of said second diode to trigger said second diode into conduction when a pulse is developed in said primary winding in response to said first diode being triggered into conduction, said second diode, when triggered into conduction coupling said power source to said load.

12. A switching circuit for selectively coupling a pair of opposite polarity power sources to a single load in response to pulses of predetermined amplitudes and opposite polarities comprising a first control circuit responsive to said pulses of only one polarity for coupling one of said sources to said load, a second control circuit responsive to said pulses of only the other polarity for coupling the other of said sources to said load, each of said control circuits including; first and second four layer diodes, means for coupling said pulses across said first diode, a transformer having primary and secondary windings, a capacitor connecting said primary winding in series circuit across the anode and cathode of said first diode, means for connecting said secondary winding across the anode and cathode of said second diode, and means for connecting said load and said source in series circuit with the anode cathode path of said second diode.

13. A switching circuit for selectively coupling a pair of opposite polarity power sources to a single load in response to pulses of predetermined amplitude and opposite polarities comprising a first control circuit responsive to said pulses of only one polarity for coupling one of said sources to said load, a second control circuit responsive to said pulses of only the other polarity for coupling the other of said sources to said load, each of said control circuits including; first and second two terminal elements, each of said elements having a conducting and non-conducting state between its said two terminals, said elements being rendered into the conducting state from the normally non-conducting state upon the application of a first voltage of predetermined magnitude and polarity across its said two terminals and into the non-conducting state from the conducting state upon the application of a second predetermined voltage across its said two terminals, said first predetermined voltage magnitude being less than the predetermined amplitude, said second predetermined voltage magnitude being less than the first predetermined voltage magnitude, first means for connecting said two terminals of said first element to the signal source, means for generating a pulse when said first element changes state in response to attainment of the predetermined amplitude level by the signal, means for coupling the pulse generated by said last named means across said two terminals of the second element to change the state thereof, and means for coupling the potential to the load through the second element when the second element changes state.

References Cited by the Examiner

UNITED STATES PATENTS 2,594,336 4/52 Mohr ---------------- 307—88.5

ARTHUR GAUSS, *Primary Examiner*.